(12) United States Patent
Zhang et al.

(10) Patent No.: US 10,464,184 B2
(45) Date of Patent: Nov. 5, 2019

(54) MODIFYING SUBSTRATE THICKNESS PROFILES

(71) Applicant: Applied Materials, Inc., Santa Clara, CA (US)

(72) Inventors: Jimin Zhang, San Jose, CA (US); Zhihong Wang, Santa Clara, CA (US); Wen-Chiang Tu, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 886 days.

(21) Appl. No.: 14/272,302

(22) Filed: May 7, 2014

(65) Prior Publication Data

US 2015/0321312 A1   Nov. 12, 2015

(51) Int. Cl.
| | |
|---|---|
| B24B 37/04 | (2012.01) |
| H01L 21/304 | (2006.01) |
| B24B 37/013 | (2012.01) |
| B24B 37/10 | (2012.01) |
| B24B 37/20 | (2012.01) |
| B24B 37/30 | (2012.01) |

(Continued)

(52) U.S. Cl.
CPC ............. *B24B 37/04* (2013.01); *B24B 9/065* (2013.01); *B24B 37/013* (2013.01); *B24B 37/042* (2013.01); *B24B 37/105* (2013.01); *B24B 37/205* (2013.01); *B24B 37/30* (2013.01); *B24B 37/345* (2013.01); *H01L 21/304* (2013.01); *H01L 21/3212* (2013.01); *H01L 21/7684* (2013.01); *H01L 22/12* (2013.01); *H01L 22/20* (2013.01); *H01L 22/26* (2013.01)

(58) Field of Classification Search
CPC ....... B24B 37/042; B24B 37/04; B24B 37/30; B24B 37/013; B24B 37/26; B24B 37/24; H01L 21/3212
USPC .................................. 451/44, 41, 57, 58, 65
See application file for complete search history.

(56) References Cited

U.S. PATENT DOCUMENTS

| | | | |
|---|---|---|---|
| 6,292,265 B1 | 9/2001 | Finarov et al. | |
| 6,685,543 B2 * | 2/2004 | Lai ........................ | B24B 37/013 257/E21.23 |

(Continued)

FOREIGN PATENT DOCUMENTS

KR   10-0814416   3/2008

OTHER PUBLICATIONS

International Search Report and Written Opinion in International Application No. PCT/US2015/028938, dated Jul. 31, 2015, 9 pages.

*Primary Examiner* — Monica S Carter
*Assistant Examiner* — Lauren M Beronja
(74) *Attorney, Agent, or Firm* — Fish & Richardson P.C.

(57) ABSTRACT

Before a first surface of a substrate is polished using a chemical mechanical process, the substrate is transferred to a modification station. The substrate comprises a side wall connected with the first surface at an edge and a second surface opposite to the first surface and also connected to the side wall. The first surface is substantially flat. The side wall is substantially perpendicular to the first surface. The edge of the substrate is modified at the modification station by removing material from a region of the first surface. The side wall of the substrate is a boundary of the region. The modified edge comprises a modified first surface that tapers within the region towards the second surface. The side wall remains substantially perpendicular to the first surface.

19 Claims, 6 Drawing Sheets

(51) Int. Cl.
*B24B 9/06* (2006.01)
*H01L 21/321* (2006.01)
*B24B 37/34* (2012.01)
*H01L 21/66* (2006.01)
*H01L 21/768* (2006.01)

(56) References Cited

U.S. PATENT DOCUMENTS

| | | |
|---|---|---|
| 7,008,309 B2 | 3/2006 | Strasbaugh |
| 7,074,109 B1 | 7/2006 | Bennett et al. |
| 7,402,520 B2 * | 7/2008 | Donohoe .......... H01L 21/02032 |
| | | 257/E21.438 |
| 7,409,260 B2 | 8/2008 | David et al. |
| 7,833,907 B2 | 11/2010 | Anderson et al. |
| 8,298,916 B2 * | 10/2012 | Vaufredaz ......... H01L 21/76256 |
| | | 257/E21.088 |
| 2003/0139049 A1 * | 7/2003 | Nakamura ............. B24B 9/065 |
| | | 438/692 |
| 2003/0232502 A1 * | 12/2003 | Asakawa ............. H01L 21/304 |
| | | 438/692 |
| 2005/0284568 A1 * | 12/2005 | America ............... B08B 7/0057 |
| | | 156/345.5 |
| 2011/0250824 A1 | 10/2011 | Yamaguchi et al. |
| 2013/0273812 A1 | 10/2013 | Qian et al. |
| 2014/0051336 A1 * | 2/2014 | Huang .................... B24D 7/18 |
| | | 451/44 |

* cited by examiner

MODIFYING SUBSTRATE THICKNESS PROFILES

TECHNICAL FIELD

The present disclosure relates to chemical mechanical polishing and more specifically to modifying substrate thickness profiles.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is that variations in the slurry composition, the polishing pad condition, the relative speed between the polishing pad and the substrate, the initial thickness of the substrate layer, and the load on the substrate can cause variations in the material removal rate at different locations of the same substrate or the material remove rate of different substrates.

SUMMARY

In one aspect, a method comprises, before a first surface of a substrate is polished using a chemical mechanical process, transferring the substrate to a modification station. The substrate comprises a side wall connected with the first surface at an edge and a second surface opposite to the first surface and also connected to the side wall. The first surface is substantially flat. The side wall is substantially perpendicular to the first surface. The edge of the substrate is modified at the modification station by removing material from a region of the first surface. The side wall of the substrate is a boundary of the region. The modified edge comprises a modified first surface that tapers within the region towards the second surface. The side wall remains substantially perpendicular to the first surface. The substrate with the modified edge is transferred to be polished.

In another aspect, a system comprises a modification station comprising a support and a modification device for modifying a thickness profile of a substrate. The substrate to be modified comprises a side wall connected with the first surface at an edge and a second surface opposite to the first surface and also connected to the side wall. The first surface is substantially flat. The side wall is substantially perpendicular to the first surface. The modification device is configured to modify the edge of the substrate at the modification station by removing material from a region of the first surface. The side wall of the substrate is a boundary of the region. The modified edge comprises a modified first surface that tapers within the region towards the second surface. The side wall remains substantially perpendicular to the first surface after the modification. The system also comprises a polishing apparatus comprising a rotatable platen to support a polishing article, a carrier head to hold a substrate in contact with a polishing surface of the polishing article, and a transfer mechanism configured to transfer the substrate between the modification station and the polishing apparatus. The carrier head has one or more controllable zones.

In another aspect, a substrate is prepared to be chemical mechanically polished. The substrate comprises a conductive layer comprising a first surface, a silicon wafer comprising a second surface, a patterned underlying layer between the conductive layer and the silicon wafer, and a side wall. The first surface has a center region and an edge region surrounding the center region. The side wall is connected with the first surface in the edge region and the second surface. The side wall is substantially flat and is a boundary of the edge region of the first surface. The first surface is substantially flat in the center region and substantially perpendicular to the side wall, and the first surface in the edge region tapers within the region towards the second surface.

The methods and systems can improve polishing uniformity.

The details of one or more embodiments of the invention are set forth in the accompanying drawings and the description below. Other features, objects, and advantages of the invention will be apparent from the description and drawings, and from the claims.

DETAILED DESCRIPTION

Overview

When a surface of a substrate including multiple dies is polished using a chemical mechanical polishing process, sometimes substrate material(s) at different locations of the surface is removed at different rates. For example, substrate material(s) in a surface region near the edge of the substrate can be removed at a higher rate than that in a surface region near a center of the substrate. As a result, if the polishing process terminates when dies near the substrate center are adequately polished, dies at the substrate edge may have been over-polished and become non-usable. On the other hand, if the polishing process terminates when the dies at the substrate edge are adequately polished to prevent over-polishing of these dies, the dies near the substrate center may have been under-polished with an unwanted layer of materials remaining on the dies. For example, the unwanted layer could be a copper layer, which may potentially cause electrical failures when the dies are used.

The chemical mechanical polishing processes of this disclosure includes one or more additional steps that modify thickness profiles of the substrates before the substrates are polished. The modification can be performed mechanically, chemically, or chemical mechanically. With the one or more additional steps, the polished substrates can have a uniform metal line topography that provides uniform electrical properties and good yields for the polishing processes.

Figure 4:
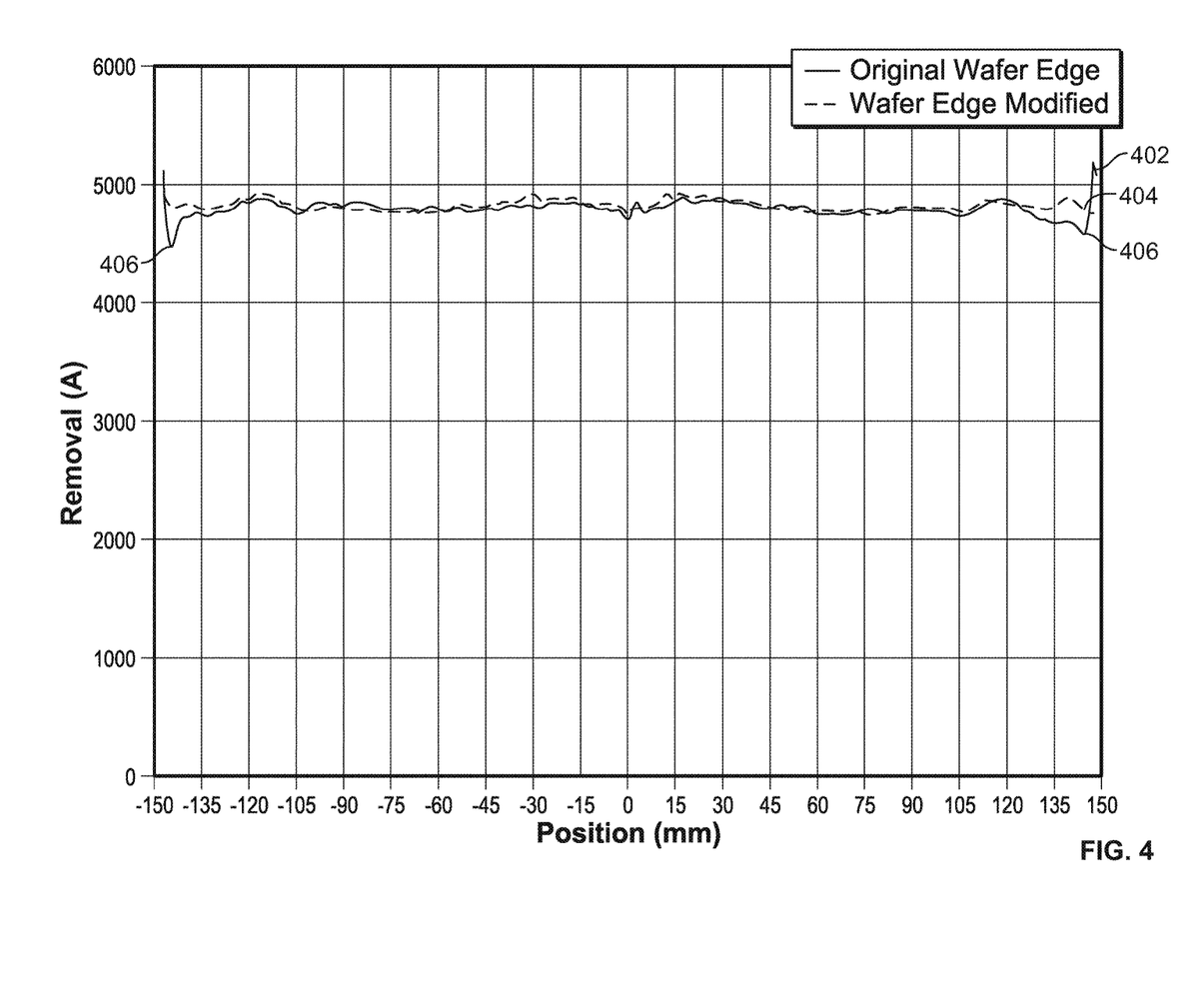
FIG. 4 illustrates a plot of two curves showing amounts of materials removed at different radius of a wafer.

In the example shown in FIG. 4, a wafer having a diameter of about 300 mm is polished. A removal profile 402 is generated for a chemical mechanical polishing process that does not include the additional step(s) of this disclosure and another removal profile 404 is generated using the chemical mechanical polishing process of this disclosure with the additional step(s) of this disclosure.

The removal profile 402 shows a so-called "check point" 406, i.e., a local maximum or minimum of layer thickness of fairly sharp slope, on the polished wafer at about 144 mm from the center of the wafer. In the region beyond the check point and towards the edge of the wafer, more wafer material(s) than in the region from the center of the wafer up to the check point. In other words, the polished wafer has an over-polished edge region between the check point 406 and the edge. In contrast, the removal profile 404 shows a generally uniform thickness profile of the polished wafer, which contains no check points like the check point 406.

Example Polishing Systems

Figure 1A:
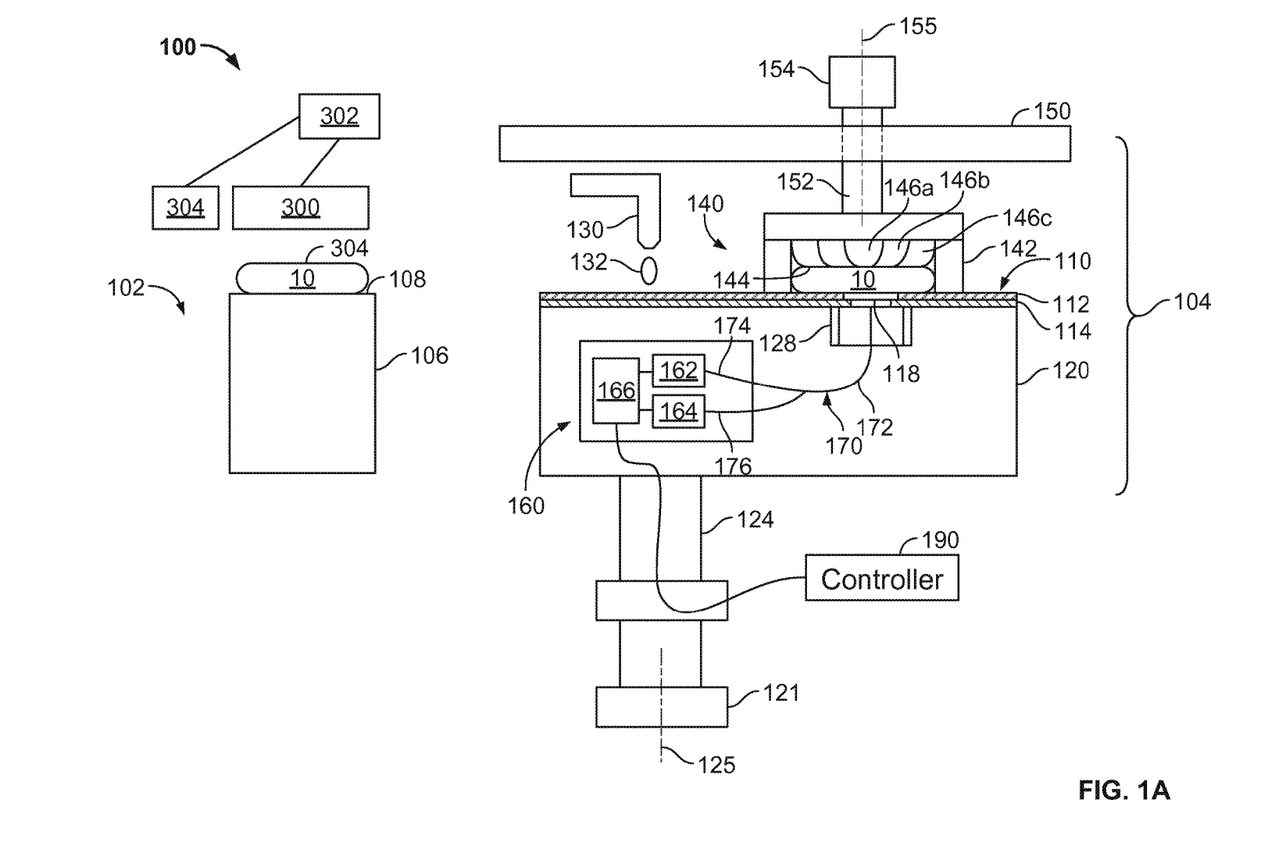
FIG. 1A illustrates a schematic cross-sectional view of an example of a polishing system.

FIG. 1 illustrates an example of a polishing system 100 including a modification station 102 and a polishing apparatus 104. A substrate 10 to be polished can be transferred between the modification station 102 and the polishing apparatus for thickness modification and polishing, e.g., before the substrate 10 is polished at the polishing apparatus 104. The transfer of the substrate 10 can be made using a mechanism, such as a robotic arm, between the station 102 and the apparatus 104.

In some implementations, the station 102 and the apparatus 104 are stand-alone with respect to each other and are located in the vicinity of each other, e.g., in the same processing room. Although not shown in the figure, the station 102 can also be integrated in the apparatus 104. For example, the substrate 10 can be moved, e.g., by rotation of a platen 120, between a polishing position under a polishing head 140 and a modification position under a modification mechanism (not shown). In another example, another polishing head different from the polishing head 140 can act as a modification head to perform the modification process.

The modification station 102 includes a support structure 106 that provides a surface 108 to receive the substrate 10. A modification apparatus 300 can be controlled by a user or a controller 302 to selectively modify thicknesses at different locations of a surface 304 of the substrate 10. In general, rather than polishing the entire substrate, the modification apparatus 300 focuses on removing material from the edge of the substrate.

Examples of the modification apparatus 300 include abrasive tapes, polishing disks, polishing head with pad and slurry, polishing tape and slurry, and chemicals. The modification apparatus 300 can be brought in contact with the surface 304 to remove materials from selected regions of the surface. For example, thickness of regions having a linear size in the order of 1-20 mm, e.g., 5 mm, can be modified. The thickness modification can be in the order of nanometers, e.g., 10-100 nm or 50-100 nm.

The controller 302 can store a pre-determined thickness profile for the substrate 10 and can control the modification of the substrate thickness based on the stored profile. For example, using the stored profile and the actual thickness profile or predicted thickness profile of the substrate, the device 300 can be instructed to modify the thickness of the substrate to reach the stored profile. In some implementations, the controller 302 stores data, e.g., in the form of a lookup table, that contains information about the amount and type of thickness modification to be performed for each type of substrate. For example, for the wafer discussed with respect to FIG. 4 that needs to have a top layer of copper removed, the stored data can be remove wafer material(s) from the check point to the edge of the wafer by a certain amount. The data can be empirically determined for each type of substrate and the associated polishing apparatus 104. Alternatively, the data can be determined in-situ based on a desired thickness profile for a given type of substrate and in-situ measurement of the substrate polishing.

The modification station 102 can also include a monitoring system 304 that provides in-situ measurement or off-line measurement of the thickness modification. Examples of the monitoring system 304 include eddy current sensors, OCD (optical critical dimension) measurements, and other sensors with thickness information. In some implementations, the monitoring system 304 can communicate with the controller 302 to provide feedback to and control the modification process. In situations where the modification is performed before or during the polishing process of the substrate 10, the modification may not need to be precise. The thickness modification not only changes the thickness of the substrate 10, but also changes the polishing dynamics of the polishing process implemented after the modification. The polishing process can reach a uniform in-wafer polishing, e.g., without having the check points as shown in FIG. 4.

The platen 120 included in the polishing apparatus 104 is a rotatable disk-shaped platen on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 104 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

The polishing apparatus 104 includes one or more carrier heads 140 (only one shown). Each carrier head 140 is operable to hold a substrate 10, such as a wafer, against the polishing pad 110. Each carrier head 140 can have independent control of the polishing parameters, for example pressure, associated with each respective substrate. Each carrier head includes a retaining ring 142 to hold the substrate 10 in position on the polishing pad 110 and below a flexible membrane 144.

Figure 2:
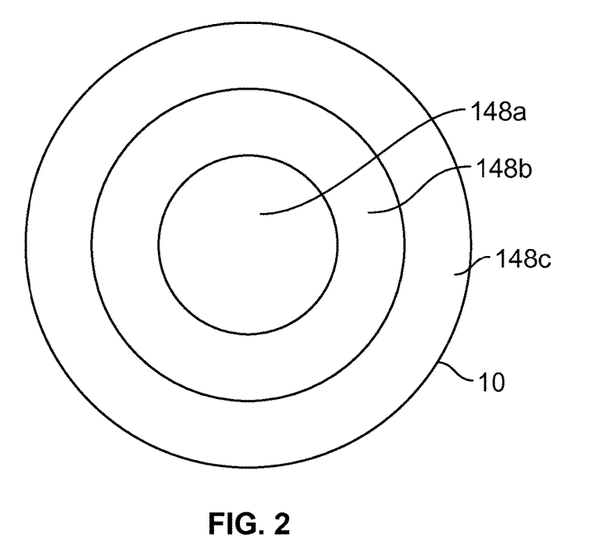
FIG. 2 illustrates a schematic top view of a substrate having multiple zones.

Each carrier head 140 also includes a plurality of independently controllable pressurizable chambers defined by the membrane, e.g., three chambers 146a-146c, which can apply independently controllable pressurizes to associated zones 148a-148c on the flexible membrane 144 and thus on the substrate 10 (see FIG. 2).

Referring to FIG. 2, the center zone 148a can be substantially circular, and the remaining zones 148b-148c can be concentric annular zones around the center zone 148a. Although only three chambers/zones are illustrated in FIGS. 1 and 2 for ease of illustration, there could be two chambers/zones, or four or more chambers/zones, e.g., five chambers/zones. In some implementations, each carrier head 140 includes a single pressurizable chamber.

Returning to FIG. 1, each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage 108 that supports the carrier head 140 along the track.

In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ optical monitoring system 160, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118.

Figure 3:
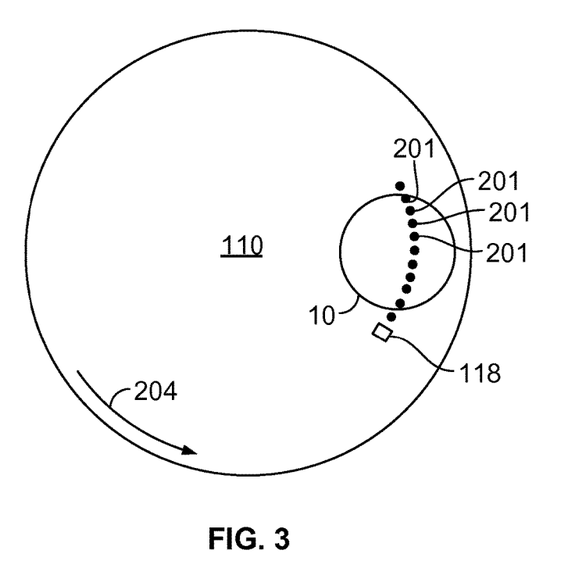
FIG. 3 illustrates a top view of a polishing pad and shows locations where in-situ measurements are taken on a first substrate.

Referring to FIG. 3, if the window 118 is installed in the platen, due to the rotation of the platen (shown by arrow 204), as the window 108 travels below a carrier head, the optical monitoring system making spectra measurements at a sampling frequency will cause the spectra measurements to be taken at locations 201 in an arc that traverses the substrate 10.

Figure 1B:
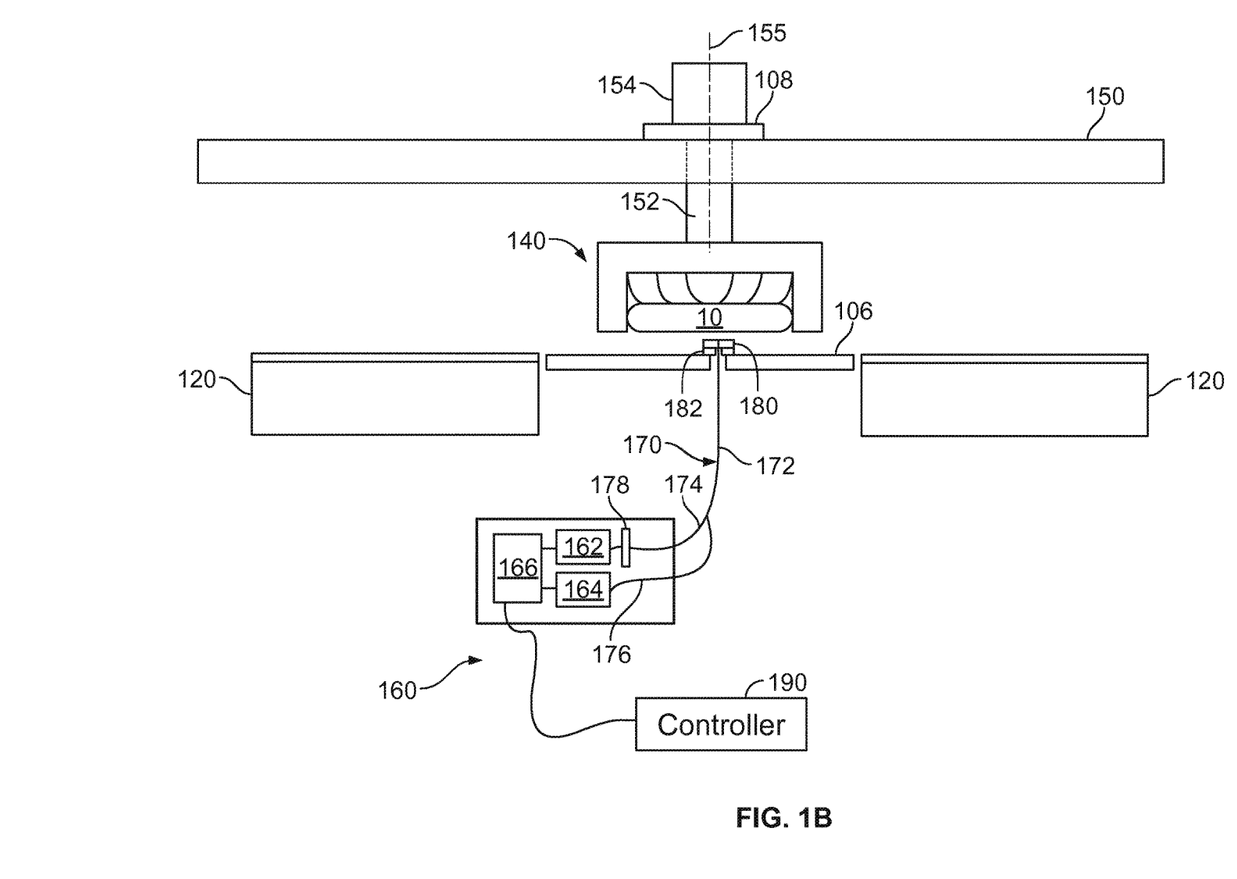
FIG. 1B illustrates a schematic cross-sectional view of an example of an in-line monitoring station.

In some implementation, illustrated in FIGS. 1A and 1B, the polishing apparatus includes an in-sequence optical monitoring system 160 having a probe 180 positioned between two polishing apparatuses or between a polishing apparatus and a transfer station. The monitoring system 160 can continuously or periodically monitor one or more features of the zones of the substrate during polishing. For example, one feature is a thickness of each zone of the substrate. The probe 180 of the in-sequence monitoring system 160 can be supported on a platform 106, and can be positioned on the path of the carrier head.

The probe 180 can include a mechanism to adjust its vertical height relative to the top surface of the platform 106. In some implementations, the probe 180 is supported on an actuator system 182 that is configured to move the probe 180 laterally in a plane parallel to the plane of the track 128. The actuator system 182 can be an XY actuator system that includes two independent linear actuators to move probe 180 independently along two orthogonal axes. In some implementations, there is no actuator system 182, and the probe 180 remains stationary (relative to the platform 106) while the carrier head 126 moves to cause the spot measured by the probe 180 to traverse a path on the substrate.

Modifying the Substrate Thickness Profile

Figure 5A:
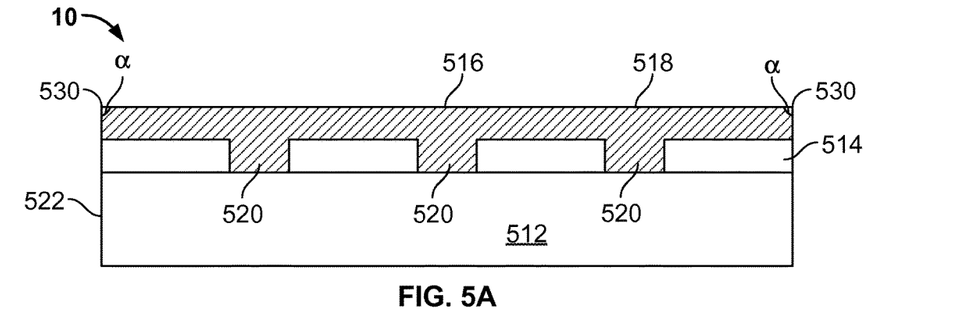
FIG. 5A illustrates a schematic cross-sectional view of an example substrate before the thickness profile of the substrate is modified.

Referring to FIG. 5A, as an example, the substrate 10 can include a silicon wafer 512 and a conductive layer 516, e.g., a metal such as copper, disposed over one or more patterned underlying layers 514, which can be semiconductor, conductor or insulator layers. The patterned underlying layers 514 can include metal features, e.g., vias, pads and interconnects 520. The conductive layer 516 has an exposed surface 518 to be polished using a polishing system, such as the polishing system 100 of FIG. 1A. Prior to polishing, the bulk of conductive layer 516 is initially relatively thick, e.g., about 600 nm to several microns or about 700 nm, and continuous, and can have a low electrical resistivity. Before polishing, the substrate 10 can have a total thickness of about 0.5 mm to about 1 mm, e.g., about 0.8 mm.

Figure 5B:
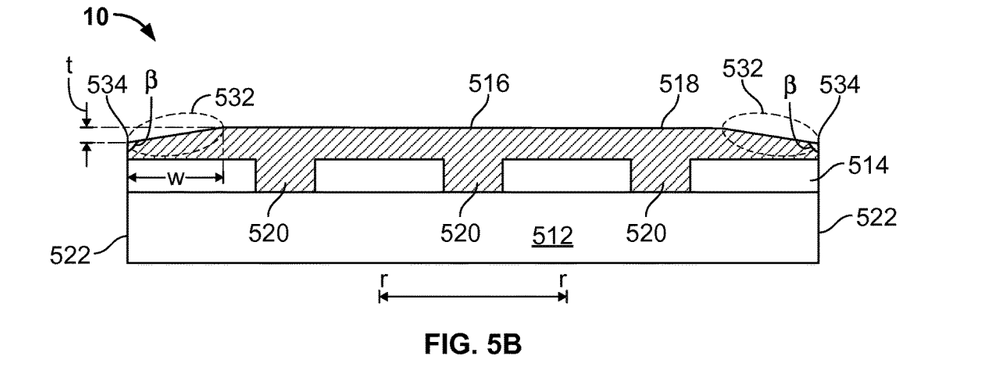
FIG. 5B illustrates a schematic cross-sectional view of an example substrate after the thickness profile of the substrate is modified.
Figure 5C:
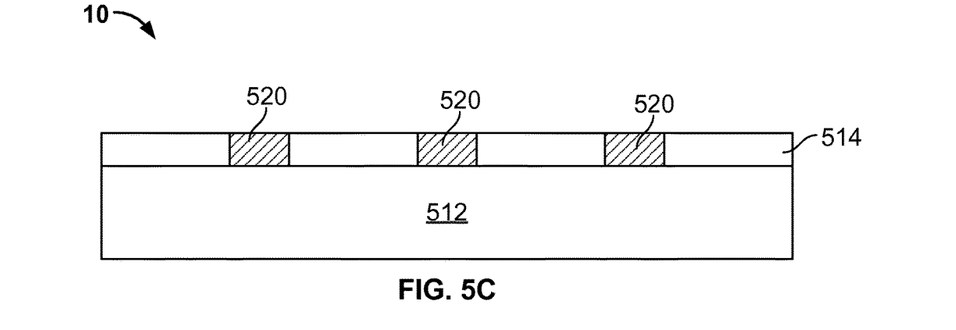
FIG. 5C illustrates a schematic cross-sectional view of an example substrate after a top layer of the substrate is removed.

Referring to FIG. 5C, using the chemical mechanical polishing process, the bulk portion of the conductive layer 516 is thinned, such that eventually the bulk portion of conductive layer 516 is removed. The patterned insulative layer 514 is exposed, with interconnects 520 remaining in among the pattern of the layer 514.

Referring again to FIG. 5A, generally, the substrate 10 to be polished has a side wall 522 perpendicular to the surface 518 of the layer 516, forming a sharp edge 530 with an edge angle $\alpha$ of about 90°. Without being limited to any particular theory, during polishing, the sharp configuration of the edge 530 causes high stress to concentrate near the edge, which can in turn cause the material removal rate to be higher near the edge than near the center of the surface 518. As described previously in connection with FIG. 4, the varying removal rates on the surface 518 lead to low die yield.

Referring to FIGS. 5B and 1A, the exposed substrate surface 518 can be modified at the modification station 102 to produce a modified substrate edge region 532. In particular, the substrate edge region 532 is thinned. The modification can be performed mechanically, chemically, or chemical mechanically. For instance, the edge 530, including the surface 518 and/or the side surface 522 can be polished by abrasive tapes, by a polish disk, or by a polish head with pad and slurry. The edge 530 can also be modified chemically by various chemicals under suitable conditions. The modification can be performed before the substrate 10 is polished.

In the modified edge region 532, the exposed substrate surface 518 tapers towards the layers 514, 522 so that the thickness of the layer 516 at the side wall 522 is less than the thickness of the layer 516 at the inner diameter of the region 532, by a depth t. Thus, the layer 516 is thinner at the side wall 522 than outside of the edge region 532, e.g., near the center of the substrate. The modification can be applied to an edge region of the surface 518 having a width w so that the surface 518 starts to taper at around the width w from the side wall 522. The edge region 532 can be an annular region on the substrate. The tapering can be circularly symmetric around the center of the substrate.

In some implementations, the modification process is applied to the edge region 532 without modifying the thickness of a center region surrounded by the edge region. Thus, a thickness of a center region can be maintained through the thinning process. In addition, the center region 532 of the surface 518 can remain substantially flat. In some implementations, the modification process is primarily applied to the surface 518 without modifying the side wall 522 along the radial direction r of the substrate 10.

The thickness difference t and the width w can be chosen based on one or more factors, e.g., the dimensions and type of the substrate 10, the dimensions and materials of the layer 516, the parameters associated with the polishing apparatus that chemical mechanically polishes the layer 516, etc. For example, the width w can be chosen based on the configuration of the pressure zones on the substrate 10. In some implementations, the width w is chosen to be in the same magnitude as the size of a pressure zone. When the carrier head only includes one pressure zone, the width w can be chosen to be larger than when the carrier head includes multiple pressure zones. The modification can be performed using a polishing pad that has a size or width no greater than the chosen width w.

The thickness t can be about between about 1% to 15% of the starting thickness of the layer 516. Since the layer 516 (and the thickness removed t) is thin in comparison to the width of the modified region, the taper can be very slight, e.g., many orders of magnitude different from the taper that would be present in a beveled wafer. For example, the ratio of the width of the modified region to the thickness difference can be between about 50000:1 to 400000:1. In some implementations, w is about 5 mm to 20 mm, and t is about 50 nm to about 100 nm.

The tapering surface 518 in the width w forms an angle β with the side wall 522 at an edge 534, where β is larger than 90 degrees. As the side wall 522 is not modified and remains substantially straight, the edge 534 may be sharp and not rounded.

Figure 5D:
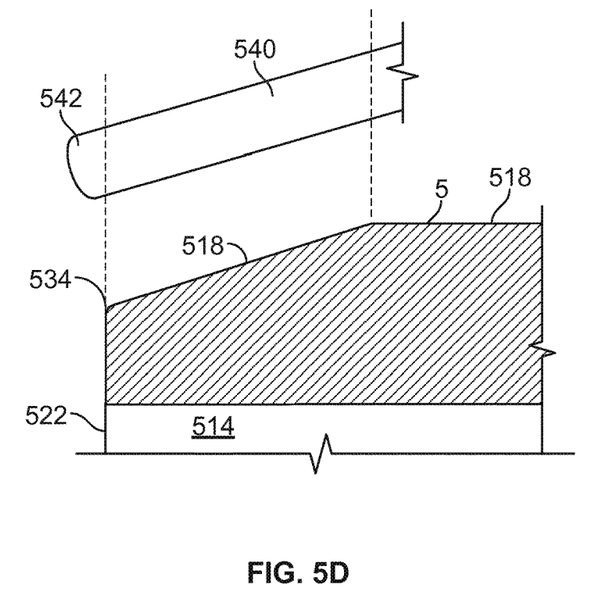
FIG. 5D illustrates a schematic cross-sectional view of an example substrate modified by a modification device to produce a rounded edge.

In some implementations, a rounded edge 534' as shown in FIG. 5D, instead of a sharp edge 534 of FIG. 5B, can be produced, e.g., during or after the modification of the surface 518. For example, when a polishing pad 540 is used to modify the surface 518, the pad overhangs the wafer side wall 522 by a portion 542 to round the edge.

Without being limited to any particular theory, by tapering the edge of the substrate, concentration of stress in the polishing pad caused by contact of the polishing pad against the substrate edge can be reduced, thereby smoothing the polishing profile and increasing polishing removal uniformity.

Figure 6:
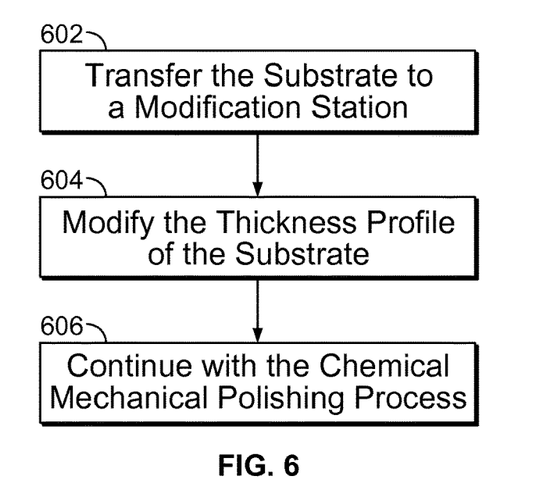
FIG. 6 is a flow diagram of an example process for modifying a thickness profile of a substrate.

Referring to FIG. 6, an example process 600 for use in modifying a thickness profile of a substrate to be, being, or that has been chemical mechanically polished is shown. Initially, before the substrate is polished, when it is determined that the thickness profile of the substrate needs to be modified, the substrate is transferred (602) to a modification station. During or after the substrate is polished, the substrate can be transferred from a polishing head of a polishing apparatus. Before the substrate is polished, the substrate can be transferred from another processing station that has processed the substrate to be polished. The thickness profile of the substrate is then mechanically, chemically, or chemical mechanically modified (604).

In particular, the modification can be performed to an edge region of the substrate surface, as described previously in connection with FIGS. 5A-5D. The modification profile, e.g., the amount of material(s) to be removed, the location of the removal, etc., can be looked up in data stored for different types of substrates and polishing systems, or can be determined in-situ. The modification can be monitored in-situ or off-line to determine whether a desired thickness profile has been reached. Sometimes, e.g., when the modified substrate is to be polished or further polished, the modification does not have to be accurate, e.g., up to nanometers, but only needs to be accurate up to 10 nanometers or larger. Finally, the substrate is transferred to continue (606) with the chemical mechanical polishing process. In situations where the modification is performed after the substrate is fully polished, the entire process ends.

Although the discussion above assumes that the wafer edge is substantially perpendicular to primary surfaces of the substrate, the techniques is applicable to substrates that begin with a beveled edge. In this case, the edge 530 should be considered to be the corner (typically at a 22° angle) between the beveled surface and the primary surface, and the modified edge region would extend inwardly from the corner. After treatment, the side wall of the bevel would remain at the same angle relative to the primary surface.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the modification station can be applicable to other types of substrate processing systems, e.g., etching or deposition systems.

Control of the various systems and processes described in this specification, or portions of them, can be implemented in a computer program product that includes instructions that are stored on one or more non-transitory machine-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method comprising:
    before a first surface of a layer of a substrate is polished using a chemical mechanical process, transferring the substrate to a modification station, the substrate comprising a side wall connected with the first surface at an edge and a second surface opposite to the first surface and also connected to the side wall, the first surface being substantially flat, the side wall being substantially perpendicular to the first surface;
    modifying the edge of the substrate at the modification station by removing material from a region of the first surface of the layer, the removing proceeding partially but not entirely through the layer such that a portion of the side wall along the layer is maintained, the side wall of the substrate being a boundary of the region, the modified edge comprising a modified first surface that has a sloped section that tapers within the region towards the second surface, the sloped section extending laterally to and ending at the portion of the side wall, and the portion of the side wall remaining substantially perpendicular to the first surface;
    transferring the substrate with the modified edge to a chemical mechanical polishing station to be polished; and
    polishing the first surface of the substrate in the chemical mechanical polishing station, wherein polishing the first surface of the substrate in the chemical mechanical polishing station comprises polishing the sloped section along an entire lateral width of the sloped section and polishing an unmodified section of the first surface that is further from the edge than the sloped section while maintaining at least a portion of the side wall that extends from the second surface, and wherein modifying the edge of the substrate at least partially compensates for non-uniformity in the polishing at the chemical mechanical polishing station.

2. The method of claim 1, wherein the region has a width of about 5 to 20 mm.

3. The method of claim 1, wherein the modified first surface tapers within the region towards the second surface by about 50 nm to about 100 nm.

4. The method of claim 1, wherein modifying the edge comprises rounding the edge.

5. The method of claim 1, wherein the substrate comprises a conductive layer comprising the first surface, a silicon wafer comprising the second surface, and a patterned underlying layer between the conductive layer and the silicon wafer, the method comprising polishing the first surface of the conductive layer such that the conductive layer is removed and the patterned underlying layer is exposed.

6. The method of claim 3, wherein the region has a width of about 5 to 20 mm.

7. The method of claim 1, wherein removing material from the region comprises removing material such that a ratio of a width of the region to a thickness difference across the region is between about 50000:1 to 400000:1.

8. The method of claim 1, wherein removing material comprises contacting the substrate to a polishing pad and slurry.

9. The method of claim 1, wherein modifying the edge of the substrate comprises removing material from the region without modifying a thickness of a center region surrounded by the region.

10. The method of claim 1, wherein modifying the edge of the substrate does not remove material on the second surface.

11. The method of claim 1, wherein during polishing of the first surface, the second surface is substantially flat.

12. A method comprising:
    before a first surface of a substrate is polished using a chemical mechanical process, transferring the substrate to a modification station, the substrate comprising a side wall connected with the first surface at an edge and a second surface opposite to the first surface and also connected to the side wall, the first surface being substantially flat, the side wall being substantially perpendicular to the first surface;
    modifying the edge of the substrate at the modification station by removing material from a region of the first surface such that a ratio of a width of the region to a thickness difference across the region is between about 50000:1 to 400000:1, the side wall of the substrate being a boundary of the region, the modified edge comprising a modified first surface that tapers within the region towards the second surface, and the side wall remaining substantially perpendicular to the first surface; and
    transferring the substrate with the modified edge to a chemical mechanical polishing station to be polished.

13. The method of claim 12, wherein the region has a width of about 5 to 20 mm.

14. The method of claim 12, wherein the substrate comprises a silicon wafer and one or more layers deposited on the silicon wafer, the first surface being an outer surface of an outermost layer of the one or more layers.

15. The method of claim 12, wherein modifying the edge of the substrate does not remove material on the second surface.

16. A method comprising:
    before a first surface of a layer of a substrate is polished using a chemical mechanical process, transferring the substrate to a modification station, the substrate comprising a side wall connected with the first surface at an edge and a second surface opposite to the first surface and also connected to the side wall, the first surface being substantially flat;
    at the modification station, removing material from a region of the first surface adjacent the edge of the substrate to generate a modified first surface having a modified portion adjacent the edge of the substrate and an unmodified portion further from the edge of the substrate than the modified portion, the removing proceeding partially but not entirely through the layer such that a portion of the side wall along the layer is maintained, the side wall of the substrate being a boundary of the region, the modified portion of the first surface having a sloped section that tapers within the region towards the second surface;

transferring the substrate with the modified first surface to a chemical mechanical polishing station to be polished; and polishing the modified first surface of the substrate in the chemical mechanical polishing station, the polishing of the modified first surface including polishing of the unmodified portion and polishing of the modified portion along an entire lateral width of the modified portion while maintaining at least a portion of the side wall that extends from the second surface, wherein removing material from a region of the first surface adjacent the edge of the substrate to generate the modified first surface at least partially compensates for non-uniformity in the polishing at the chemical mechanical polishing station.

17. The method of claim 16, wherein the sloped section that tapers within the region towards the second surface at least partially compensates for over-polishing at the edge of the substrate.

18. The method of claim 16, wherein the substrate comprises a patterned underlying layer and polishing the modified first surface proceeds until the underlying layer is exposed and material of the layer is left in trenches in the underlying layer.

19. The method of claim 16, wherein removing material from the region comprises removing material such that a ratio of a width of the region to a thickness difference across the region is between about 50000:1 to 400000:1.

* * * * *